(12) United States Patent  
Kobayashi et al.

(10) Patent No.: US 7,361,590 B2  
(45) Date of Patent: Apr. 22, 2008

(54) SEMICONDUCTOR DEVICE AND MANUFACTURING METHOD THEREOF

(75) Inventors: Kojiro Kobayashi, 6-5, Fujinosatocho, Takatsuki-shi, Osaka (JP); Akio Hirose, Ibaraki (JP); Masanori Yamagiwa, Yokohama (JP)

(73) Assignees: Nissan Motor Co., Ltd., Yokohama-shi (JP); Kojiro Kobayashi, Takatsuki-shi (JP)

( * ) Notice: Subject to any disclaimer, the term of this patent is extended or adjusted under 35 U.S.C. 154(b) by 6 days.

(21) Appl. No.: 11/334,391

(22) Filed: Jan. 19, 2006

(65) Prior Publication Data

US 2006/0160330 A1    Jul. 20, 2006

(30) Foreign Application Priority Data

Jan. 20, 2005    (JP) .............................. 2005-012333

(51) Int. Cl.
*H01L 21/4763* (2006.01)
*H01L 21/44* (2006.01)

(52) U.S. Cl. ...................... 438/642; 438/610; 438/644; 257/E21.021

(58) Field of Classification Search ................ 438/610, 438/642, 644; 257/E21.021
See application file for complete search history.

(56) References Cited

U.S. PATENT DOCUMENTS

| | | |
|---|---|---|
| 7,180,197 B2 * | 2/2007 | Nishi et al. ................. 257/783 |
| 2004/0245648 A1 | 12/2004 | Nagasawa et al. |

FOREIGN PATENT DOCUMENTS

| | | |
|---|---|---|
| CN | 1354513 A | 6/2002 |
| CN | 1564726 A | 1/2005 |
| JP | 2004-128357 A | 4/2004 |
| WO | WO 03/077311 A1 | 9/2003 |

OTHER PUBLICATIONS

"Metal Data Book," Published by Seisiro Murata, Mar. 25, 1993, pp. 96-97.
E. Ide, et al., "The Novel Bonding Process Using Ag Nanoparticles—Investigation on Bondability to Cu-," Mate 2004, pp. 213-218.
Y. Saito, et al., "High Temperture Oxidation of Metals," Published by Uchida Rokakuho Publishing Co., Ltd., Dec. 10, 1996, p. 10.

* cited by examiner

*Primary Examiner*—Scott B. Geyer
*Assistant Examiner*—Seahvosh Nikmanesh
(74) *Attorney, Agent, or Firm*—Foley & Lardner LLP

(57) ABSTRACT

A method of manufacturing a semiconductor device includes: preparing a semiconductor element having a first metal layer made of first metal on a surface thereof, and a metal substrate made of second metal, the metal substrate having a fourth metal layer made of fourth metal on a surface thereof, and mounting the semiconductor element on the surface thereof; providing metal nanopaste between the first metal layer and the fourth metal layer, the metal nanopaste being formed by dispersing fine particles made of third metal with a mean diameter of 100 nm or less into an organic solvent; and heating, or heating and pressurizing the semiconductor element and the metal substrate between which the metal nanopaste is provided, thereby removing the solvent. Further, each of the first, third and fourth metals is made of any metal of gold, silver, platinum, copper, nickel, chromium, iron, lead, and cobalt, an alloy containing at least one of the metals, or a mixture of the metals or the alloys. By the manufacturing method, it is possible to bond the semiconductor element to the metal substrate favorably.

6 Claims, 2 Drawing Sheets

SEMICONDUCTOR DEVICE AND MANUFACTURING METHOD THEREOF

BACKGROUND OF THE INVENTION

1. Field of the Invention

The present invention relates to a semiconductor device and a manufacturing method thereof.

2. Description of the Related Art

A technology for bonding two members by heating and baking metal nanoparticles in place of the conventional solder is described in Japanese Patent Laid-Open Publication No. 2004-128357.

Moreover, in the following document, surfaces of copper test pieces are bonded to each other by using silver nanopaste formed of silver nanoparticles coated with an organic solvent, a bonding strength of the test pieces is measured, and a cross-sectional texture of the bonded portion is observed (refer to "The Novel Bonding Process Using Ag Nanoparticles", Collection announced on Mate 2004, p. 213).

SUMMARY OF THE INVENTION

As a method of bonding a semiconductor element on a metal substrate, a method using a variety of solders is used in general, and besides, a method using conductive paste, brazing, and the like are also examined. However, the solder and the conductive paste are low in thermal resistance, and in the brazing, a residual stress of the bonded portion after the bonding is large, leading to low reliability. Moreover, for the bonding technology using the metal nanoparticles in the above-described Publication and document, detailed examination has not been made yet. As described above, a satisfactory bonding method of the semiconductor element to the metal substrate has not been realized yet.

It is an object of the present invention to provide a semiconductor device and a manufacturing method thereof, which are capable of favorably bonding the semiconductor element to the metal substrate.

The first aspect of the present invention provides a method of manufacturing a semiconductor device comprising: preparing a semiconductor element having a first metal layer made of first metal on a surface thereof, and a metal substrate made of second metal, the metal substrate having a fourth metal layer made of fourth metal on a surface thereof, and mounting the semiconductor element on the surface thereof; providing metal nanopaste between the first metal layer and the fourth metal layer, the metal nanopaste being formed by dispersing fine particles made of third metal with a mean diameter of 100 nm or less into an organic solvent; and heating, or heating and pressurizing the semiconductor element and the metal substrate between which the metal nanopaste is provided, thereby removing the solvent, wherein each of the first, third and fourth metals is made of any metal of gold, silver, platinum, copper, nickel, chromium, iron, lead, and cobalt, an alloy containing at least one of the metals, or a mixture of the metals or the alloys.

The second aspect of the present invention provides a semiconductor device comprising: a semiconductor element having a first metal layer made of first metal on a surface thereof, a metal substrate made of second metal, the metal substrate having a fourth metal layer made of fourth metal on a surface thereof, and mounting the semiconductor element on the surface thereof, and a bonding layer which bonds the first metal layer and the fourth metal layer to each other, the bonding layer being provided between the first metal layer and the fourth metal layer, wherein each of the first, third and fourth metals is made of any metal of gold, silver, platinum, copper, nickel, chromium, iron, lead, and cobalt, an alloy containing at least one of the metals, or a mixture of the metals or the alloys.

BRIEF DESCRIPTION OF THE DRAWINGS

The invention will now be described with reference to the accompanying drawings wherein.

DETAILED DESCRIPTION OF THE PREFERRED EMBODIMENT

Figure 1A:
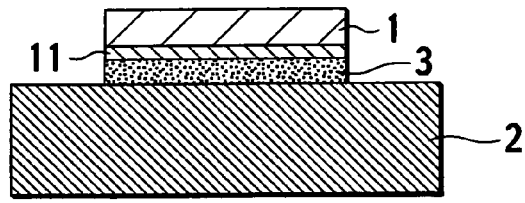
FIG. 1A is a cross-sectional view showing a semiconductor element and a metal substrate according to a first embodiment of the present invention before being bonded to each other.

Embodiments of the present invention are described below in detail by using the drawings. Note that the same reference numerals are assigned to components having the same functions, and a duplicate description thereof is omitted.

First Embodiment

Figure 1B:
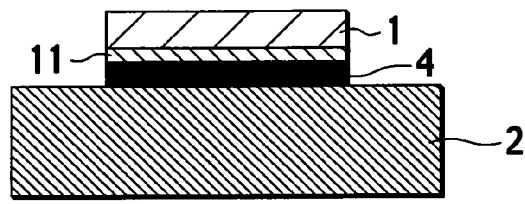
FIG. 1B is a cross-sectional view showing the semiconductor element and the metal substrate according to the first embodiment of the present invention after being bonded to each other.

FIG. 1A shows a semiconductor element and a metal substrate before being bonded to each other in a first embodiment of the present invention, and FIG. 1B shows the semiconductor element and the metal substrate after being bonded to each other.

A manufacturing method of this embodiment is a method of bonding a semiconductor element 1 and a metal substrate 2 to each other by using metal nanopaste 3. Here, the semiconductor element (semiconductor chip) 1 is one of a surface mounting type, which has a first metal layer 11 formed of first metal on at least one of two main surfaces opposite to each other. The metal substrate 2 is one which is formed of second metal and mounts the semiconductor element 1 on a surface thereof. Moreover, the metal nanopaste 3 is one in which ultra fine particles formed of third metal with a mean diameter of 100 nm or less are dispersed into an organic solvent. Then, each of the first, second and third metals is made of any metal of gold (Au), silver (Ag), platinum (Pt), copper (Cu), nickel (Ni), chromium (Cr), iron (Fe), lead (Pb), and cobalt (Co), an alloy containing at least one of these metals, or a mixture of these metals or alloys (a mixture of gold particles and silver particles, a mixture of silver particles and copper alloy particles, and the like).

A description is made below in detail of the manufacturing method of a semiconductor device and a configuration of the semiconductor device.

<Preparation of Members>

First, the semiconductor element 1, the metal nanopaste 3, and the metal substrate 2 are prepared. One made of silicon (Si) can be used as the semiconductor element 1. On a back surface of the semiconductor element 1, a titanium (Ti) layer for making an ohmic connection between the semiconductor element 1 and the metal substrate 2 is formed, a nickel layer for preventing a diffusion of a different type of metal into the semiconductor element 1 is formed thereon, and a silver layer serving as the first metal layer 11 is finally formed thereon. The first metal layer 11 can be formed on the semiconductor element 1 by a vacuum evaporation method or an electrolytic deposition method. Note that the titanium layer and the nickel layer are not shown. Moreover, in this embodiment, the metal substrate 2 is made of copper.

In this embodiment, the third metal constituting the metal nanopaste 3 is made of silver. The silver nanopaste is formed of silver particles with a particle diameter of approximately 10 nm, and is one of a paste form in which the silver particles are dispersed into the solvent in a state where peripheries of the silver particles are further coated with a protection film formed of an organic material. In the case of heating the silver nanopaste, when the nanopaste reaches a certain temperature, the solvent and the organic protection film are decomposed and volatilized, and surfaces of the silver as the ultra fine particles appear. The silver nanopaste is made to function as a bonding material by using such a principle that the ultra fine particles are sintered together.

Although there is some difference depending on materials, as a basic feature of the metal nanoparticles, the particles at such a nanolevel are agglomerated and sintered together at a temperature lower than a melting point of bulk thereof owing to surface energy thereof. Specifically, the silver nanopaste is an adhesive using a phenomenon that, though the ultra fine silver particles usually exist stably in the solvent without being bonded together, the silver particles which are ultra fine are sintered together when the organic material is volatilized by a heat treatment.

Note that a mean diameter of the third metal in the metal nanopaste for use in the present invention differs depending on the melting point of the third metal. Specifically, in the case of metal in which the melting point is low, the metal is agglomerated and sintered together at a low temperature even if a mean diameter thereof is large. However, in the case of metal in which the melting point is high, a mean diameter thereof must be reduced in order to agglomerate and sinter the metal at a low temperature. From this viewpoint, when the third metal is one of the above-described metals, it is necessary that the mean diameter be 100 nm or less. When the third metal is silver, the third metal with a particle diameter of approximately 10 nm exerts the above-described effect best.

<Manufacturing Method of Semiconductor Device>

Next, the bonding is performed by using the respective members.

First, on a predetermined surface of the metal substrate 2 made of Cu, on which the semiconductor element 1 is mounted, the silver nanopaste 3 is coated with a uniform thickness by using a screen printing method.

Thereafter, the semiconductor element 1 on the back surface of which the first metal layer 11 made of Ag is formed is disposed on the metal substrate 2 so that the back surface thereof can be adhered to the silver nanopaste 3, followed by heating. In such a way, the top surface of the first metal layer 11 made of Ag on the back surface of the semiconductor element 1, the top surfaces of the silver nanoparticles as the third metal, and the top surface of the metal substrate 2 made of Cu are reduced by carbon contained in the organic material constituting the silver nanopaste 3. Then, by agglomeration of the silver nanoparticles in which the surfaces are reduced, the semiconductor element 1 and the silver particles start to be bonded to each other, and the metal substrate 2 and the silver particles start to be bonded to each other. As a result, as shown in FIG. 1B, a semiconductor device, in which the semiconductor element 1 and the metal substrate 2 are bonded to each other by a bonding layer 4 made of Ag, is obtained.

Note that, with regard to a temperature at the time of the above-described heating, it is necessary to perform the heating until the organic solvent and the protection film in the metal nanopaste 3 are decomposed by heat. Specifically, it is appropriate to perform the heating at approximately 300° C. Moreover, at the time of the heating, the semiconductor element 1 and the metal substrate 2 may be pressurized in a vertical direction with respect to the bonded surfaces thereof. Thus, water and carbon dioxide, which are generated when the organic material is decomposed, can be removed from the metal nanopaste 3, and the bonding layer 4, which is dense, is generated. In the case of performing the pressurization, pressurization with a pressure of several hundreds kPa to several MPa is appropriate. However, the pressurization is not an essential requirement in the manufacturing method of the present invention.

<Reason for Limiting Metallic Element>

Here, each of the first, second and third metals is made of any metal of gold, silver, platinum, copper, nickel, chromium, iron, lead, and cobalt, the alloy containing at least one of these metals, or the mixture of these metals or alloys.

It is possible to explain the material, which is reducible by the carbon contained in the organic material constituting the metal nanopaste 3, by stability of an oxide thereof. The stability can be derived by standard free energy of formation of the oxide in each substance. Specifically, a substance having numerically larger energy of formation at a certain temperature has a larger affinity for oxygen, and forms a more stable oxide. Hence, when two substances to be oxidized exist, the substance having numerically larger energy of formation is considered to function as a reducer while the other substance is being oxidized.

Actually, with reference to a standard free energy of formation-temperature diagram of oxides (refer to "Metal Data Book", 3$^{rd}$ edition, p. 96, edited by The Japan Institute of Metals) and an oxidation-reduction equilibrium diagram (refer to "High Temperature Oxidation of Metals", p. 10, written by Saitoh, Y., et al., issued by Uchida Rokakuho Pub.), which are generally known in the field of metallurgical engineering, carbon (C) can be a reducer at approximately 300° C. for an oxide of copper (CuO, Cu$_2$O), an oxide of chromium (CrO$_3$), and the like. Moreover, it is understood that carbon can also be a reducer for an oxide of nickel (NiO) at around approximately 500° C. Gold, silver, and platinum are defined to be materials originally difficult to be oxidized.

Hence, in the present invention, gold, silver, and platinum can be used as the metals difficult to be oxidized, and copper, nickel, chromium, iron, lead, cobalt can be used as general metals, which are reducible by the organic material and free from serious problems in particular for use and in terms of the environment. However, it is preferable for the first metal to contain any metal of gold, silver, platinum, and copper, or the alloy containing at least one of these metals from a viewpoint of facilitating the coating thereof on the semiconductor device and the reduction thereof.

As described above, as the method of bonding the semiconductor element to the metal substrate, a method using a variety of solders is used in general, and besides, a method using conductive paste, brazing, and the like have been examined. However, a melting point of the conventional eutectic solder (60% Sn-40% Pb) is approximately 183° C., and a melting point of the conventional high temperature solder (5% Sn-95% Pb) is approximately 300° C., and an operating temperature of a semiconductor device subjected to a bonding process using these solders has been limited to approximately 183° C. or less. Moreover, even in the case of only using the high temperature solder in order to raise the operating temperature, since the entire bonding must be completed by one step, and a degree of difficulty thereof is high, such concerns as an adverse effect to yield and a cost increase of the product have remained. Even if the above-described concerns have been solved by some measures, such a problem on reliability remains that crystal grains of the solder are enlarged by the use thereof at the high temperature, leading to an easy occurrence of a crack. A similar thing can also be said about lead-free solder.

The conductive paste is a bonding material capable of performing the bonding at the low melting point and keeping bondability thereof (being usable) at the high temperature. The conductive paste is also capable of reducing a residual stress of the bonded portion. However, it is general that the maximum usable temperature of the conductive paste depends on resin functioning as the bonding material, and for example, the maximum usable temperature has such limitations as 300° C. under the operation for several hours. Moreover, a point that adhesion force of the conductive paste is weak since strength of the bonded portion thereby is lower than that by the solder is regarded as a problem. In addition, there has been a problem that bonding property of the conductive paste is unstable, leading to an easy occurrence of variations in electric/thermal properties.

In the brazing, a melting point of a brazing material is high. Specifically, a melting point of an Ag—Cu brazing material is approximately 780° C., and a melting point of an Al—Si brazing material is approximately 580° C. Accordingly, the residual stress of the bonded portion is increased, and a crack has occurred in the bonded portion or the element itself in a cooling step after the bonding. Moreover, even if the bonding itself is performed without trouble, an adverse effect on long-term reliability of the semiconductor device is inevitable because of the above-described large residual stress.

As opposed to this, it is said that the bonding method of Japanese Patent Laid-Open Publication No. 2004-128357 is a bonding method, which is capable of performing the bonding at the low melting point and keeping the bondability at the high temperature, and capable of obtaining high bonding strength equivalent to the case of using the solder or more, thereby being excellent also in the electric/thermal properties. However, detailed examination regarding bonding property of materials to be bonded and the metal nanoparticles has not been implemented yet, and there is no prospect of practical use of the method concerned under the actual circumstances. For example, in the case of bonding a semiconductor bare chip to an aluminum substrate by the metal nanoparticles, it is necessary to form a metal layer on the chip in advance in consideration of the bonding property of the metal layer to the metal nanoparticles. Simultaneously, since a strong oxide film exists on the top surface of the aluminum, it is necessary to give some surface treatment also to the aluminum substrate. Heretofore, the above-described point has not been examined.

According to the manufacturing method of this embodiment, the bonded portion of the semiconductor element 1 and the metal substrate 2 has a bonding structure composed of the first metal constituting the first metal layer 11 on the surface of the semiconductor element 1, the second metal constituting the metal substrate 2, and the third metal constituting the ultra fine particles of the metal nanopaste 3. Each of these metals is composed of gold, silver, or platinum, which is difficult to be oxidized, any metal of copper, nickel, chromium, iron, lead, and cobalt, which is easy to be reduced by carbon contained in the organic solvent, the alloy containing at least one of these metals, or the mixture of these metals or alloys. Therefore, the oxide on the top surface of the metal concerned is reduced by the organic material, and the respective metals can be bonded by pure surfaces thereof. Hence, such strong surface mounting, which is the best also in terms of the electric/thermal properties, can be achieved.

Moreover, in the metal nanopaste 3, when the organic solvent and the protection film are decomposed and volatilized at a certain temperature, the respective metal nanoparticles made of the third metal are brought into direct contact with one another, and the sintering at the low temperature, which is intrinsic to the nanoparticles, is started. Then, the bonding layer 4 made of the third metal is formed, which bonds the first metal on the surface of the semiconductor element 1 and the second metal constituting the metal substrate 2 to each other. Therefore, in the case of using the metal nanopaste 3, the bonding can be performed at a relatively low temperature, and in addition, the metal nanopaste 3 can keep the bondability at a temperature equal to the above-described low temperature or more, for example, up to a melting point of the third metal staying in a bulk state. This means that this bonding material can be used any number of times for the same part, and the conventional process using the high temperature solder and the eutectic solder in two steps is replaceable by use of only the same metal nanopaste.

Second Embodiment

Figure 2A:
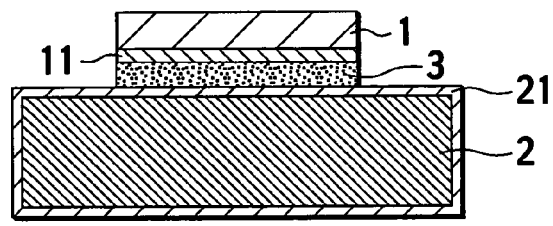
FIG. 2A is a cross-sectional view showing a semiconductor element and a metal substrate according to a second embodiment of the present invention before being bonded to each other.
Figure 2B:
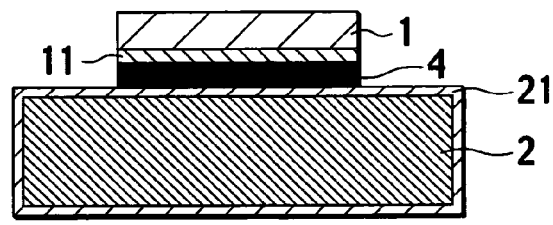
FIG. 2B is a cross-sectional view showing the semiconductor element and the metal substrate according to the second embodiment of the present invention after being bonded to each other.

FIG. 2A shows a semiconductor element and a metal substrate before being bonded to each other in a second embodiment of the present invention, and FIG. 2B shows the semiconductor element and the metal substrate after being bonded to each other. In FIGS. 2A and 2B, reference numeral 21 denotes a fourth metal layer made of fourth metal, on which the semiconductor element 1 is surface mounted.

A different point of the semiconductor device of this embodiment from the semiconductor device of the first embodiment is that, when the second metal constituting the metal substrate 2 is not the metal limited in the above description, for example, when the second metal is made of pure aluminum, the fourth metal layer 21 made of the metal limited in the above description, for example, made of silver is formed on such an Al metal substrate 2 by using plating, vapor deposition, and the like. Since the pure aluminum has such properties as small deformation resistance and high ductility, the pure aluminum can bring an effect of absorbing the stress caused in a bonded portion thereof to a different material by a difference in coefficient of thermal expansion from the different material. However, in the case of attempting the bonding while using the pure aluminum as the second metal and using the materials according to the first embodiment as the other materials, since the strong oxide film stably exists on the top surface of the aluminum, it is extremely difficult to bond the metal substrate to the semiconductor element by using the silver nanoparticles. Hence, the surface of the aluminum is subjected to Ag plating in advance, thus making it possible to solve the above-described problem, and to obtain an equivalent effect to that of the first embodiment. In addition, it is made possible to absorb the stress in the bonded portion owing to the pure aluminum.

Here, besides the pure aluminum, an aluminum alloy can also be used as the second metal. Moreover, while it is necessary that the fourth metal be metal bondable to the third metal, specifically, the fourth metal is composed of any metal of gold, silver, platinum, copper, nickel, chromium, iron, lead, and cobalt, the alloy containing at least one of these metals, or the mixture of these metals or alloys. However, it is preferable that the fourth metal be made of any metal of gold, silver, platinum, and copper, or an alloy containing at least one of these metals from a viewpoint of easiness in coating thereof on the metal substrate 2 and easiness in reduction thereof.

<Manufacturing Method of Semiconductor Device>

In a manufacturing method of this embodiment, first, as in the first embodiment, the first metal layer 11 made of the first metal is formed on at least one main surface of the semiconductor element 1. Moreover, on the surface of the metal substrate 2, the fourth metal layer 21 made of the fourth metal is formed by using a method such as plating.

Next, on a predetermined surface of the fourth metal layer 21, on which the semiconductor element 1 is mounted, the silver nanopaste 3 is coated with a uniform thickness by using the screen printing method. Thereafter, as in the first embodiment, the semiconductor element 1 on which the first metal layer 11 is formed is disposed so that the first metal layer 11 can be adhered to the silver nanopaste 3, followed by heating. In such a way, the top surface of the first metal layer 11 made of Ag on the back surface of the semiconductor element 1, the top surfaces of the silver nanoparticles as the third metal, and the top surface of the fourth metal layer 21 made of the fourth metal are reduced by the carbon contained in the organic material constituting the silver nanopaste 3. Then, by agglomeration of the silver nanoparticles in which the surfaces are reduced, the semiconductor element 1 and the silver particles start to be bonded to each other, and the fourth metal layer 21 and the silver particles start to be bonded to each other. As a result, as shown in FIG. 2B, a semiconductor device, in which the semiconductor element 1 and the fourth metal layer 21 are bonded to each other by the bonding layer 4 made of Ag, is obtained.

As described above, according to the manufacturing method of this embodiment, the bonded portion of the semiconductor element 1 and the metal substrate 2 has a bonding structure by the first metal constituting the first metal layer 11, the fourth metal constituting the fourth metal layer 21, and the third metal in the metal nanopaste 3. Accordingly, a similar effect to that of the first embodiment can be obtained. In addition, such metal as the aluminum and the aluminum alloy, which are easy to be deformed by a small stress, can be used as the second metal constituting the metal substrate 2, and accordingly, it is made possible to absorb the stress caused by the difference in coefficient of thermal expansion between the different materials. The stress cannot be absorbed only by the first, third and fourth metals.

Third Embodiment

Figure 3A:
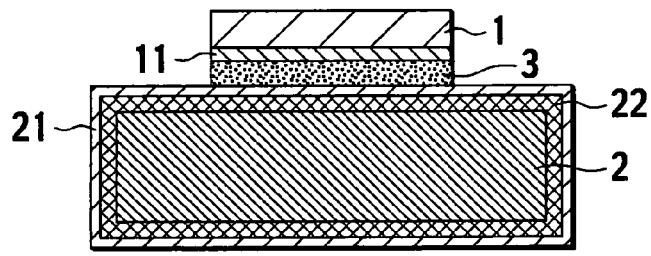
FIG. 3A is a cross-sectional view showing a semiconductor element and a metal substrate according to a third embodiment of the present invention before being bonded to each other.
Figure 3B:
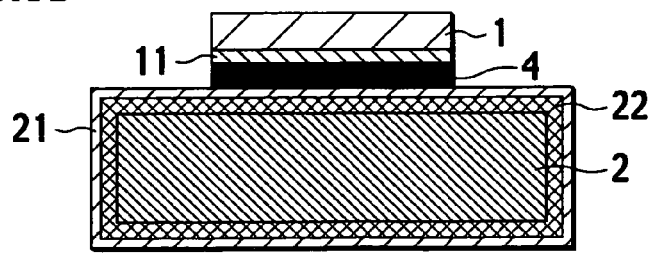
FIG. 3B is a cross-sectional view showing the semiconductor element and the metal substrate according to the third embodiment of the present invention after being bonded to each other.

FIG. 3A shows a semiconductor element and a metal substrate before being bonded to each other in a third embodiment of the present invention, and FIG. 3B shows the semiconductor element and the metal substrate after being bonded to each other. In FIGS. 3A and 3B, reference numeral 22 denotes a first interposed layer interposed between the metal substrate 2 and the fourth metal layer 21 on which the semiconductor element 1 is surface mounted.

A different point of a semiconductor device of this embodiment from the semiconductor device of the second embodiment is that the first interposed layer 22 is provided as a barrier layer between the metal substrate 2 and the fourth metal layer 21 on the surface thereof. For example, when the metal substrate 2 is made of aluminum, and the fourth metal layer 21 is made of silver, there is a risk that the aluminum and the silver are mutually diffused. Accordingly, this embodiment has a configuration in which the first interposed layer 22 made of Ni or Ti is interposed between the second metal constituting the metal substrate 2 and the fourth metal constituting the fourth metal layer 21 in order to prevent the mutual diffusion of both thereof. Thus, more reliable bonding can be ensured.

<Manufacturing Method of Semiconductor Device>

In a manufacturing method of this embodiment, first, as in the first embodiment, the first metal layer 11 made of the first metal is formed on at least one main surface of the semiconductor element 1. Moreover, on the metal substrate 2 made of pure aluminum, the first interposed layer 22 is formed by the method such as plating. Then, on the surface of the metal substrate 2, on which the first interposed layer 22 is formed, the fourth metal layer 21 is further formed by the method such as plating.

Next, on a predetermined surface of the fourth metal layer 21, on which the semiconductor element 1 is mounted, the metal nanopaste 3 is coated with a uniform thickness by using the screen printing method. Thereafter, as in the first embodiment, the semiconductor element 1 on which the first metal layer 11 is formed is disposed so that the first metal layer 11 can be adhered to the metal nanopaste 3, followed by heating. As a result, as shown in FIG. 3B, a semiconductor device, in which the semiconductor element 1 and the fourth metal layer 21 are bonded to each other by the bonding layer 4, is obtained.

As described above, according to the semiconductor device and the manufacturing method thereof in this embodiment, the first interposed layer 22 exists as the barrier layer between the second metal constituting the metal substrate 2 and the fourth metal layer 21 formed on the metal substrate 2. Accordingly, such diffusion reactions of the respective metals can be prevented, and reliable bonding can be ensured.

Fourth Embodiment

Figure 4A:
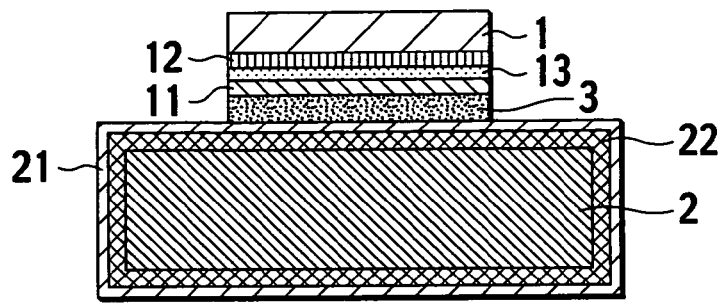
FIG. 4A is a cross-sectional view showing a semiconductor element and a metal substrate according to a fourth embodiment of the present invention before being bonded to each other.
Figure 4B:
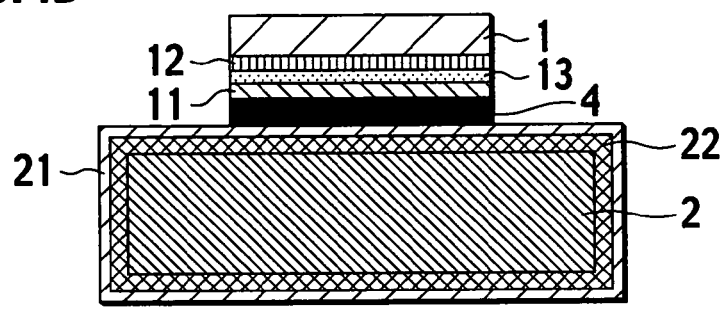
FIG. 4B is a cross-sectional view showing the semiconductor element and the metal substrate according to the fourth embodiment of the present invention after being bonded to each other.

FIG. 4A shows a semiconductor element and a metal substrate before being bonded to each other in a fourth embodiment of the present invention, and FIG. 4B shows the semiconductor element and the metal substrate after being bonded to each other. In FIGS. 4A and 4B, reference numeral 12 denotes an electrode of the semiconductor element 1, and reference numeral 13 denotes a second interposed layer interposed between the electrode 12 and the first metal layer 11 formed on the lower surface of the semiconductor element 1.

A different point of a semiconductor device of this embodiment from the semiconductor device of the third embodiment is that not the back surface of the semiconductor element 1 but the surface of the semiconductor element 1, on which the electrode exists, is bonded to the metal substrate by using the metal nanopaste. In general, on the surface of the semiconductor element 1, the aluminum electrode 12 made of fifth metal, for example, of pure aluminum exists. If the first metal layer 11 made of silver is directly provided on the aluminum electrode 12, the aluminum and the silver may be mutually diffused. Accordingly, this embodiment has a configuration in which the second interposed layer 13 made of Ni or Ti is interposed between the fifth metal constituting the electrode 12 and the first metal constituting the first metal layer 11 in order to prevent the mutual diffusion of both thereof. Thus, more reliable bonding can be ensured. However, the second interposed layer 13 is not an essential requirement in the present invention.

In addition, by using a method of this embodiment, it is made possible to perform the bonding using the metal nanopaste for both of the surface and back surface of the semiconductor element 1. Specifically, the repeated bonding in the same part, which is one of the effects of the bonding using the metal nanoparticles, is possible. For example, in a transistor element and the like, such a process is also made possible, in which, after a collector electrode on the back surface of the semiconductor element 1 is bonded to the metal at a collector potential (metal substrate on which the metal concerned is formed) by using the silver nanopaste, an emitter electrode on the surface of the semiconductor element 1 is bonded to a terminal of the emitter electrode by using the same silver nanopaste.

<Manufacturing Method of Semiconductor Device>

A manufacturing method of this embodiment is described. First, on one of the main surfaces of the semiconductor element 1, the electrode 12 is formed by a sputtering method and the like. Then, on the surface of the electrode 12 formed on the semiconductor element 1, the second interposed layer 13 is further formed by the sputtering method and the like. Thereafter, as in the first embodiment, the first metal layer 11 is formed on the second interposed layer 13.

Moreover, separately from the above, on the surface of the metal substrate 2, the first interposed layer 22 is formed by the method such as plating. Then, on the surface of the metal substrate 2 on which the first interposed layer 22 is formed, the fourth metal layer 21 is further formed by the method such as plating.

Next, on a predetermined surface of the fourth metal layer 21, on which the semiconductor element 1 is mounted, the metal nanopaste 3 is coated with a uniform thickness by using the screen printing method. Thereafter, as in the first embodiment, the semiconductor element 1 on which the first metal layer 11 is formed is disposed so that the first metal layer 11 can be adhered to the metal nanopaste 3, followed by heating. As a result, as shown in FIG. 4B, a semiconductor device, in which the semiconductor element 1 and the fourth metal layer 21 are bonded to each other by the bonding layer 4, is obtained.

Note that, in the drawings for the first embodiment, the second embodiment, and the third embodiment, the electrodes of the semiconductor element 1 are not shown. Moreover, in each of the structures shown in FIG. 1B, FIG. 2B, and FIG. 3B, it is naturally possible to provide the electrode 12, and further to interpose the second interposed layer 13 between the electrode 12 and the first metal layer 11 as in the fourth embodiment.

Fifth Embodiment

Figure 5A:
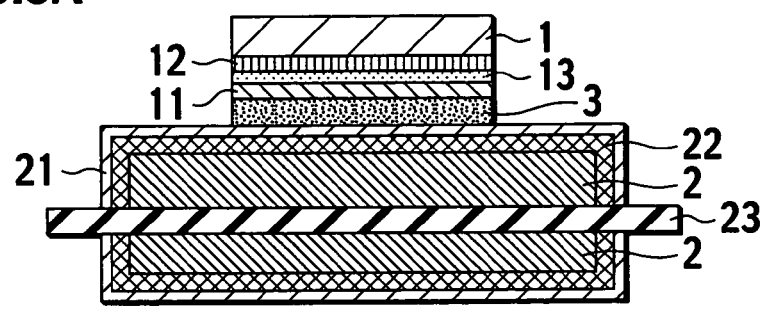
FIG. 5A is a cross-sectional view showing a semiconductor element and a metal substrate according to a fifth embodiment of the present invention before being bonded to each other.
Figure 5B:
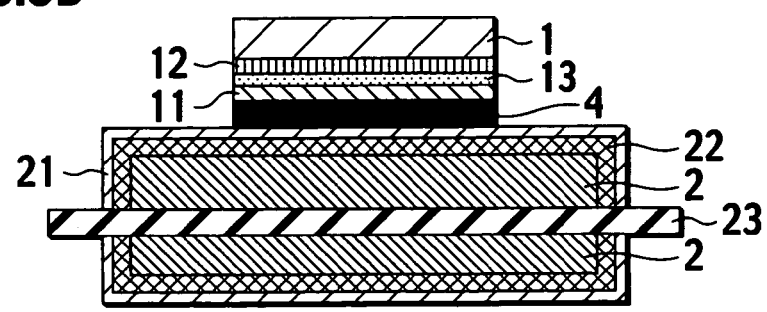
FIG. 5B is a cross-sectional view showing the semiconductor element and the metal substrate according to the fifth embodiment of the present invention after being bonded to each other.

FIG. 5A shows a semiconductor element and a metal substrate before being bonded to each other in a fifth embodiment of the present invention, and FIG. 5B shows the semiconductor element and the metal substrate after being bonded to each other. In FIGS. 5A and 5B, reference numeral 23 denotes an insulating plate.

In a semiconductor device of this embodiment, the metal substrates 2 includes the insulating plate 23. The insulating plate 23 is composed of ceramics of aluminum nitride (AlN), silicon nitride (SiN), or the like.

A different point of the semiconductor device of this embodiment from the semiconductor device of the fourth embodiment is that the insulating plate 23 is bonded to the metal substrate 2 made of the second metal in advance. Specifically, for example, when the second metal is pure aluminum, and the insulating plate 23 is made of the ceramics of aluminum nitride, silicon nitride, or the like, a configuration is made, in which the two metal substrates 2 are bonded to each other while sandwiching the insulating plate 23 therebetween. Thus, one of the metal substrates 2, which is on an opposite side to the metal substrate 2 bonded to the semiconductor element 1 with respect to the ceramics insulating plate 23, is electrically insulated completely from the opposite metal substrate 2 by the insulating plate 23. Accordingly, it is also made possible to ensure insulating property of the semiconductor device.

A manufacturing method of the semiconductor device in this embodiment is a similar method to that of the fourth embodiment. Specifically, the semiconductor element 1 in which the electrode 12, the second interposed layer 13, and the first metal layer 11 are provided, and the metal substrate 2 in which the fourth metal layer 21, the first interposed layer 22, and the insulating plate 23 are provided, are prepared in advance.

Next, on a predetermined surface of the fourth metal layer 21, on which the semiconductor element 1 is mounted, the metal nanopaste 3 is coated with a uniform thickness by using the screen printing method. Thereafter, as in the first embodiment, the semiconductor element 1 on which the first metal layer 11 is formed is disposed so that the first metal layer 11 can be adhered to the metal nanopaste 3, followed by heating. As a result, as shown in FIG. 5B, a semiconductor device, in which the semiconductor element 1 and the fourth metal layer 21 are bonded to each other by the bonding layer 4, is obtained.

Moreover, in each of the structures shown in FIG. 1B, FIG. 2B, and FIG. 3B, it is naturally possible to provide the insulating plate as in the fifth embodiment.

Note that the embodiments explained above are described for facilitating the understanding of the present invention, and are not described for limiting the present invention. Hence, the respective components disclosed in the above-described embodiments are shown as objects incorporating the entire design changes and equivalents, which belong to the technical scope of the present invention. For example, though Ag, Cu, Al and the like are used as the metals in the above embodiments, the present invention is not limited to this, and the metals may be metals according to claims and alloys thereof. In particular, though the silver nanoparticles are used as the third metal, the third metal may be metals according to claims, alloys thereof, or mixture particles of these.

Moreover, though Si is used as the semiconductor element 1, the semiconductor element 1 may be made of gallium arsenide (GaAs), silicon carbide (SiC), and the like, which are other than Si. As the effects obtained by the present invention, mentioned are the reduction of the residual stress of the bonded portion, which is obtained by the low-temperature bonding using the silver nanopaste, the relaxation of limitations on the operating temperature of the semiconductor device after the bonding, and the absorption of the stress by the aluminum substrate. As a usage purpose in which the above-described effects can be effectively utilized, mentioned is a mounting method for high-temperature use of SiC promising as a highly heat-resistant element.

The entire content of a Japanese Patent Application No. P2005-012333 with a filing date of Jan. 20, 2005 is herein incorporated by reference.

Although the invention has been described above by reference to certain embodiments of the invention, the invention is not limited to the embodiments described above will occur to these skilled in the art, in light of the teachings. The scope of the invention is defined with reference to the following claims.

What is claimed is:

1. A method of manufacturing a semiconductor device, comprising:

preparing a semiconductor element having a first metal layer made of a first metal on a surface thereof, and a metal substrate made of a second metal, the metal substrate having a fourth metal layer made of a fourth metal on a surface thereof, and mounting the semiconductor element on the surface thereof;

providing a metal nanopaste between the first metal layer and the fourth metal layer, the metal nanopaste being formed by dispersing fine particles made of a third metal with a mean diameter of 100 nm or less into an organic solvent; and heating, or heating and pressurizing, the semiconductor element and the metal substrate between which the metal nanopaste is provided, thereby removing the organic solvent, wherein each of the first, third and fourth metals is made of any metal of gold, silver, platinum, copper, nickel, chromium, iron, lead, and cobalt, an alloy containing at least one of these metals, or a mixture of these metals or these alloys.

2. A method of manufacturing a semiconductor device according to claim 1,
   wherein the second metal is the same as the fourth metal.

3. A method of manufacturing a semiconductor device according to claim 1,
   wherein the second metal is made of pure aluminum or an aluminum alloy.

4. A method of manufacturing a semiconductor device according to claim 1,
   wherein the metal nanopaste is one in which the fine particles are coated with a protection film made of an organic material and are dispersed into the solvent.

5. A method of manufacturing a semiconductor device according to claim 4,
   wherein a temperature of the heating or the heating and pressurizing is a temperature at which the organic solvent and the protection film are decomposed by heat.

6. A method of manufacturing a semiconductor device according to claim 1,
   wherein each of the first and fourth metals is any metal of gold, silver, platinum, and copper, or an alloy containing at least one of these metals.

* * * * *